United States Patent [19]

Rothe

[11] Patent Number: 5,105,097
[45] Date of Patent: Apr. 14, 1992

[54] PASSIVE MAGNETIC SWITCH FOR ERECTING MULTIPLE STAGE, HIGH-PULSE-RATE VOLTAGE MULTIPLIERS

[75] Inventor: Dietmar E. Rothe, Cardiff, Calif.
[73] Assignee: Lasertechnics, Inc., Albuquerque, N. Mex.
[21] Appl. No.: 649,576
[22] Filed: Feb. 1, 1991
[51] Int. Cl.$^5$ ............................................. H02M 9/04
[52] U.S. Cl. .................... 307/108; 307/110; 328/65; 363/59
[58] Field of Search ............................... 363/59–61; 307/108, 110; 328/65

[56] References Cited

U.S. PATENT DOCUMENTS

| | | | |
|---|---|---|---|
| 3,366,799 | 1/1968 | Fitch | 307/110 |
| 4,275,317 | 6/1981 | Laudenslager et al. | 307/415 |
| 4,698,518 | 10/1987 | Pacala | 307/106 |
| 4,900,947 | 2/1990 | Weiner et al. | 307/110 |

FOREIGN PATENT DOCUMENTS 445131  12/1974  U.S.S.R. ................. 328/65

OTHER PUBLICATIONS

R. A. Fitch, Marx and Marx-Like High Voltage Generators, IEEE Trans. Nucl. Science NS-18 (4th Symp. on Engin. Prob. of Fusion Research 1971) 190.
F. B. A. Fruengel, High Speed Pulse Technology, vol. I, Academic Press (NY 1965) pp. 297–298.
M. Gunderson, G. F. Kirkman, The Back-Lighted Thyratron, Optic News (Dec. 1989) 37.
C. H. Smith, L. Barbert, Dynamic Magnetization of Metallic Glasses, Proc. 5th IEEE International Pulsed Power Conf., Crystal City, VA (1985) 664.
C. H. Smith, Permeabilities of Metallic Glasses at High Magnetization Rates, Proc. 18th Power Mod. Symp., Hilton Head, SC (1988) 336.
C. A. Brau et al., Simple, Pulsed, Electron Beam Gun, Rev. Scient. Instrum. 48 (1977) 1154.

*Primary Examiner*—William H. Beha, Jr.
*Attorney, Agent, or Firm*—William E. Hein

[57] ABSTRACT

Megavolt voltage multipliers having an output impedance of less than 10 ohms and capable of operating at high pulse repetition frequencies, are switched with high performance saturable core inductors having multiple windings to provide voltage and current rise times of less than 50 nanoseconds. Pulse generation is actively initiated by a HV thyratron operating below 40 kilovolts and in the radar mode for long life.

9 Claims, 7 Drawing Sheets

PASSIVE MAGNETIC SWITCH FOR ERECTING MULTIPLE STAGE, HIGH-PULSE-RATE VOLTAGE MULTIPLIERS

BACKGROUND AND SUMMARY OF THE INVENTION

Fast, high-voltage (HV) pulse generators with output voltages in the 100 kV to 2 MV range are required for accelerating electrons in electron guns or heavy ions in particle accelerators and for relativistic klystron applications. High energy, fast pulse electron guns find applications in e-beam pumped gas lasers and in x-ray generators, the latter being useful for preionizing discharge pumped excimer lasers, as well as for x-ray illumination of materials and for high speed diagnostics, such as x-ray shadowgraph techniques. Other uses for fast HV pulsers are in impulse voltage testers, such as lightning simulators, and for prespiking discharge pumped high energy gas lasers.

In many of these applications, a major part of the electric pulse energy must be deposited into a dynamically varying load, which is typically between 100–1000 ohms of diode impedance for high power electron guns and x-ray generators. The load impedance can drop significantly below these values, however, as the vacuum diode proceeds to close. Gas laser prespikers may have to drive the discharge or load impedance down to approximately one ohm. Successful high voltage pulse generators for these applications should therefore have output impedances in the range of 10–100 ohms and in some instances much lower. Rise times generally should be less than 50 nanoseconds, and pulse durations in the range of 100–500 nanoseconds.

This required combination of extremely high output voltage, low output impedance and fast rise time places severe demands on the type of pulser that can be used, and particularly on the high voltage switches employed in the generating network. Traditionally, these demands have been met with multi-stage Marx banks, switched by triggered spark gaps, as described by E. Marx, Elektrotech. Z. 46 (1925) 1298, by R. A. Fitch, Marx and Marx-Like High Voltage Generators, IEEE Trans. Nucl. Science NS-18 (4th Symp. on Engin. Probl. of Fusion Research 1971) 190, and by F.B.A. Fruengel, High Speed Pulse Technology, Vol. 1, Academic Press (NY 1965) p. 298. Spark gap switches are capable of carrying high currents and providing very fast current rates of rise (dI/dt), but they are generally unsuited for pulse rate frequencies (PRF) above 10 Hz. For high PRF applications, blast spark gaps involving high gas consumption and back-lighted thyratrons (BLT) have been suggested. See F.B.A. Fruengel, High Speed Pulse Technology, Vol. 1, Academic Press (NY 1965), M. Gunderson et al., The Back-Lighted Thyratron, Optic News (Dec. 1989) 37, and W. Hartmann et al., J. Appl. Phys. 65 (1989) 4388. BLTs are disadvantageous in that they are relatively complex, require the separate generation of intense light pulses, and would prove quite expensive for a large number of voltage multiplication stages.

For generating high voltage pulses at high PRF, the conventional hot cathode high voltage thyratron is presently the most reliable switch and has been the workhorse in high voltage pulse applications involving high PRF. Thyratrons are disadvantageous, however, in that they are generally limited to 40 kilovolts of anode voltage and are not capable of generating fast rising, short pulses because of dI/dt limitations. Additionally, thyratrons cannot easily be used in multi-stage voltage multipliers because their cathodes are designed to operate near ground potential, unless the power supplies for controlling cathode and hydrogen reservoir temperatures are isolated by cumbersome high voltage isolation transformers.

A step-up pulse transformer having a secondary-to-primary winding ratio of 30:1 to produce 1 MV, for example, may be used in combination with a thyratron to generate very high voltages at high PRF. This approach, however, is only practical if slow rise times and high output impedances can be tolerated. For example, given an optimistic primary impedance of 5 ohms, including the effects of transformer leakage inductance, the output impedance of such a pulser will be approximately 5 kohms, as determined by the expression $Z_s = (N_s/N_p)^2 \cdot Z_p$.

Fast magnetic switches have recently been developed as the result of the availability of metallic glass magnetic cores having extremely rectangular hysteresis loops. Using these metallic glass magnetic cores, it is possible to design saturable core inductors having an impedance which can decrease by more than two orders of magnitude over a time interval of 10 nanoseconds. See C. H. Smith et al., Dynamic Magnetization of Metallic Glasses, Proc. 5th IEEE International Pulsed Power Conf., Crystal City, Va. (1985) 664 and Proc. 18th Power Mod. Symp., Hilton Head, S.C. (1988) 336.

The application of these fast magnetic switches for modulating the electric discharge pulse in gas lasers is described in U.S. Pat. Nos. 4,275,317 and 4,698,518.

At the present time, high voltage multiplier networks having more than two stages, such as Marx banks and multi-state LC inversion multipliers, are limited to low PRFs, because the spark gaps, traditionally used in such devices, exhibit a long recovery time and relatively short electrode life. Conversely, long-life, high-PRF switches, such as thyratrons, are not easily adapted to multiple stage multipliers, because their cathodes must be operated near ground potential.

It is therefore a principal object of the present invention to provide multistage LC inversion networks and Marx banks that employ multiple winding saturable core inductors or transformers as switches. High voltage multipliers so constructed provide the desirable properties of fast switching action and long voltage hold-off periods that are required for many pulsed power applications, while avoiding the drawbacks of the prior art described above. The multiple winding magnetic switches of the present invention exhibit low output impedance and can easily generate fast megavolt pulses at PRFs in the kHz range.

DETAILED DESCRIPTION OF THE INVENTION

Figure 1:
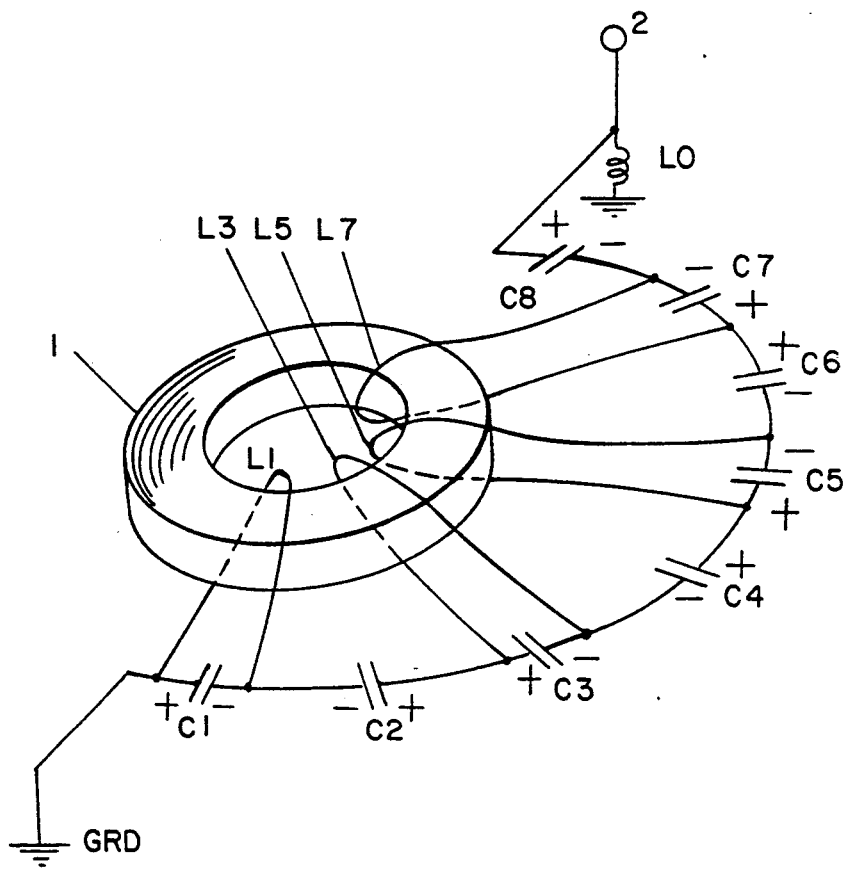
FIG. 1 is a schematic diagram of an 8-stage LC inverter voltage multiplier activated by a multiple winding saturable magnetic switch.
Figure 2:
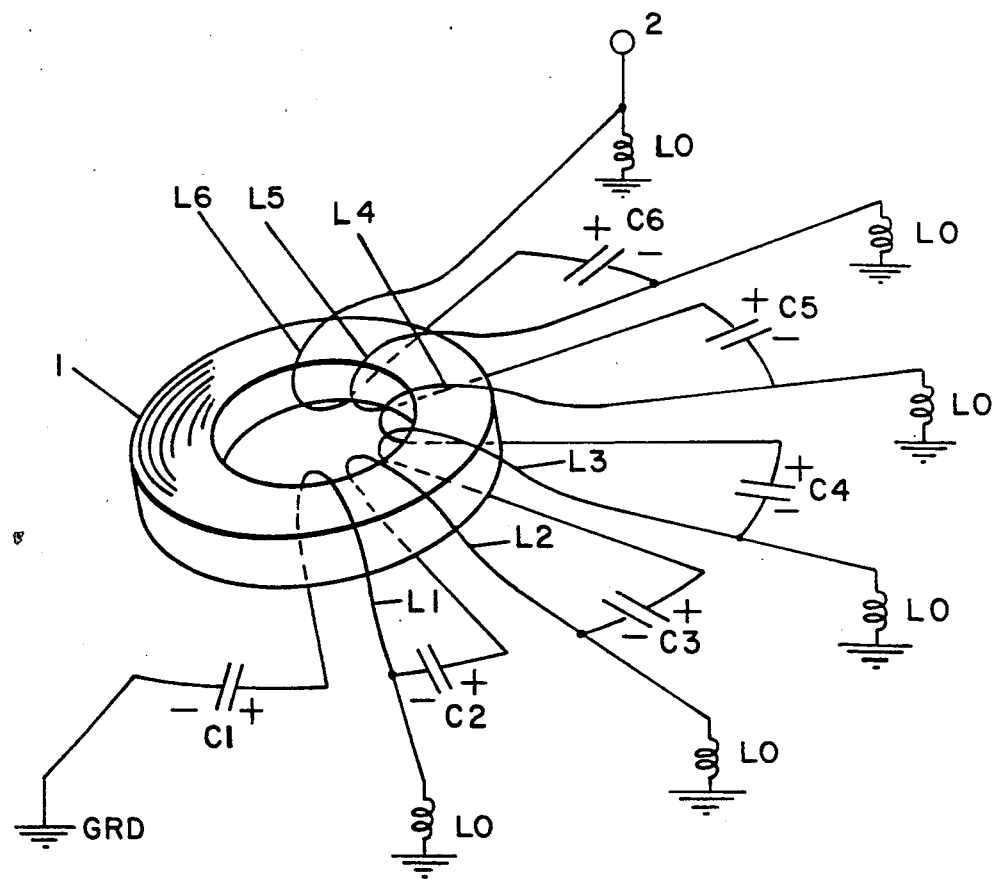
FIG. 2 is a schematic diagram of a 6-stage Marx voltage multiplier activated by a multiple winding saturable magnetic switch.

Referring now to FIGS. 1 and 2, there are shown an 8-stage LC inversion multiplier and a 6-stage Marx generator, respectively, that each employ a multiple winding saturable magnetic switch. Conventional pulse charging circuitry that may be employed in combination with these voltage multipliers is not illustrated. These multiple stage voltage multipliers promise to be highly reliable high voltage pulse generators, suitable for very high PRFs and having a virtually infinite life that is limited only by the life of the charging thyratron and capacitors to approximately $10^9$ pulses. Furthermore, such a pulser may be designed to have a low output impedance of only a few ohms, thereby enabling it to more rapidly transfer energy into a load. Separate magnetic switches with separate cores may also be employed. However, the use of multiple windings on a single core assures that all inductors switch simultaneously.

Figure 3:
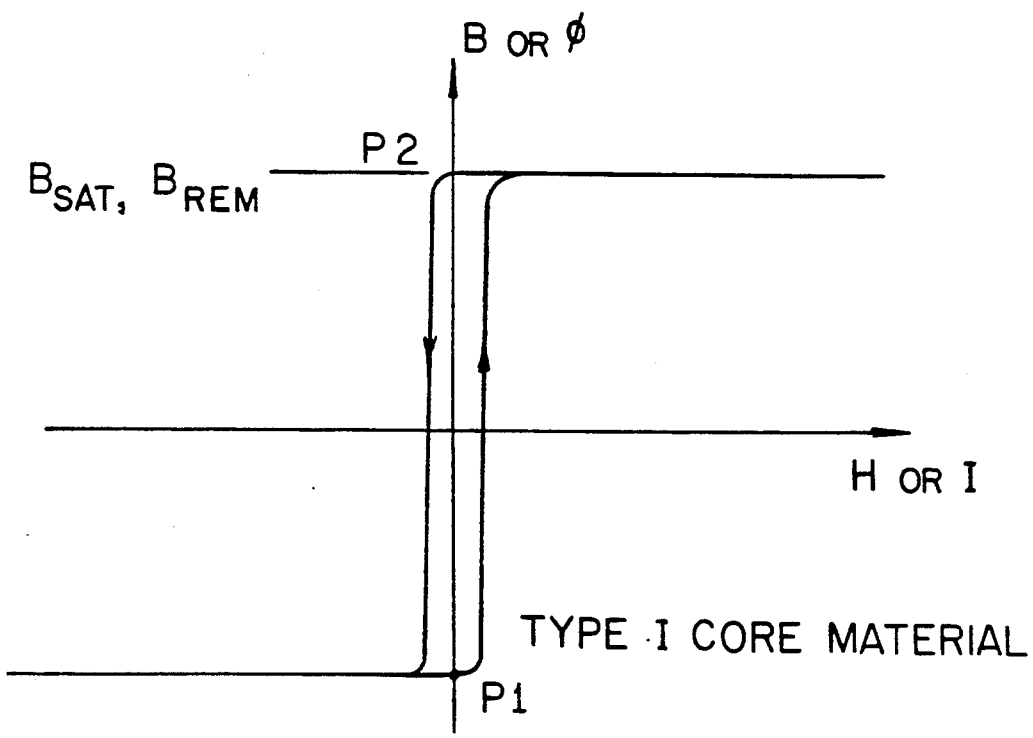
FIG. 3 is a hysteresis diagram of a typical field-annealed Metglas core, herein referred to as a Type I core material.

The LC inversion multiplier of FIG. 1 comprises a group of capacitors C1-C8 that are connected in series between electric ground GRD and a high voltage output terminal 2. The odd-numbered ones of capacitors C1-C8 are shunted by coils L1 to L7, which may comprise one or more turns wound around a common ferromagnetic core 1. Initially, core 1 is in its "reset" negative remanence state, as exemplified by point P1 on the waveform diagram of FIG. 3. Capacitors C1-C8 are then pulse charged to the same voltage, but with alternating opposite polarities, as indicated in FIG. 1. During the pulse charging cycle that typically lasts for one or more microseconds, inductors L1 to L7 exhibit a high impedance because the magnetic core 1 is in its unsaturated or high permeability state. Hence, the odd-number capacitors can easily maintain their charge during the charging cycle.

The number of turns on each of coils L1-L7 and the cross-sectional area of the core 1 are chosen such that its V.t integral as given by the expression $$\int_0^{tSAT} V.dt = A.N.\Delta B$$

allows the core to saturate at the end of the charging period. At that time, the impedances of the coils L1-L7 suddenly, and simultaneously, drop to a very low value.

This permits the charge on each of the odd numbered capacitors C1-C8 to rapidly invert, or ring through 180 degrees, thereby establishing an output voltage at terminal 2 of eight times the applied charging voltage. It should be noted that this output voltage will be maintained for some time, depending on the load, since capacitors C1, C3, etc. cannot ring back past the 180 degree point because a current reversal through coils L1, L3, etc. pushes the core into its reverse unsaturated condition, thereby strongly resisting any reverse current flow. Inductor L0 serves to maintain the output terminal 2 near ground potential during the charging phase. Its reactance is low during the relatively long charging pulse, but high during the short output pulse. The duration of the latter is approximately 1/10 of the charging time.

The Marx voltage multiplier of FIG. 2 operates in a manner similar to the LC inverter of FIG. 1 described above. The principal difference is that the saturable inductor switches L1-L6 are placed in series with and between the capacitor stages. Again, the capacitors C1-C6 are pulse charged in about one microsecond to a specified voltage with polarities as shown in FIG. 2. The inductors L0 form part of the charging network that is otherwise not illustrated and they also serve to keep the relevant parts of the circuit near ground potential during the charging cycle. When core 1 saturates at the end of the charging phase, the impedances of coils L1-L6 drop to a small value on the order of a few tens of microhenries, thereby connecting the voltages on capacitors C1-C6 in series. The "erected" output voltage at terminal 2 then becomes six times the applied charging voltage.

The output voltage produced by the Marx voltage multiplier of FIG. 2 can be made to rise faster than in an equivalent LC inverter. However, the current rise from an erected Marx circuit will be slower because the saturated switch inductances add to the output impedance for this circuit configuration.

Figure 5:
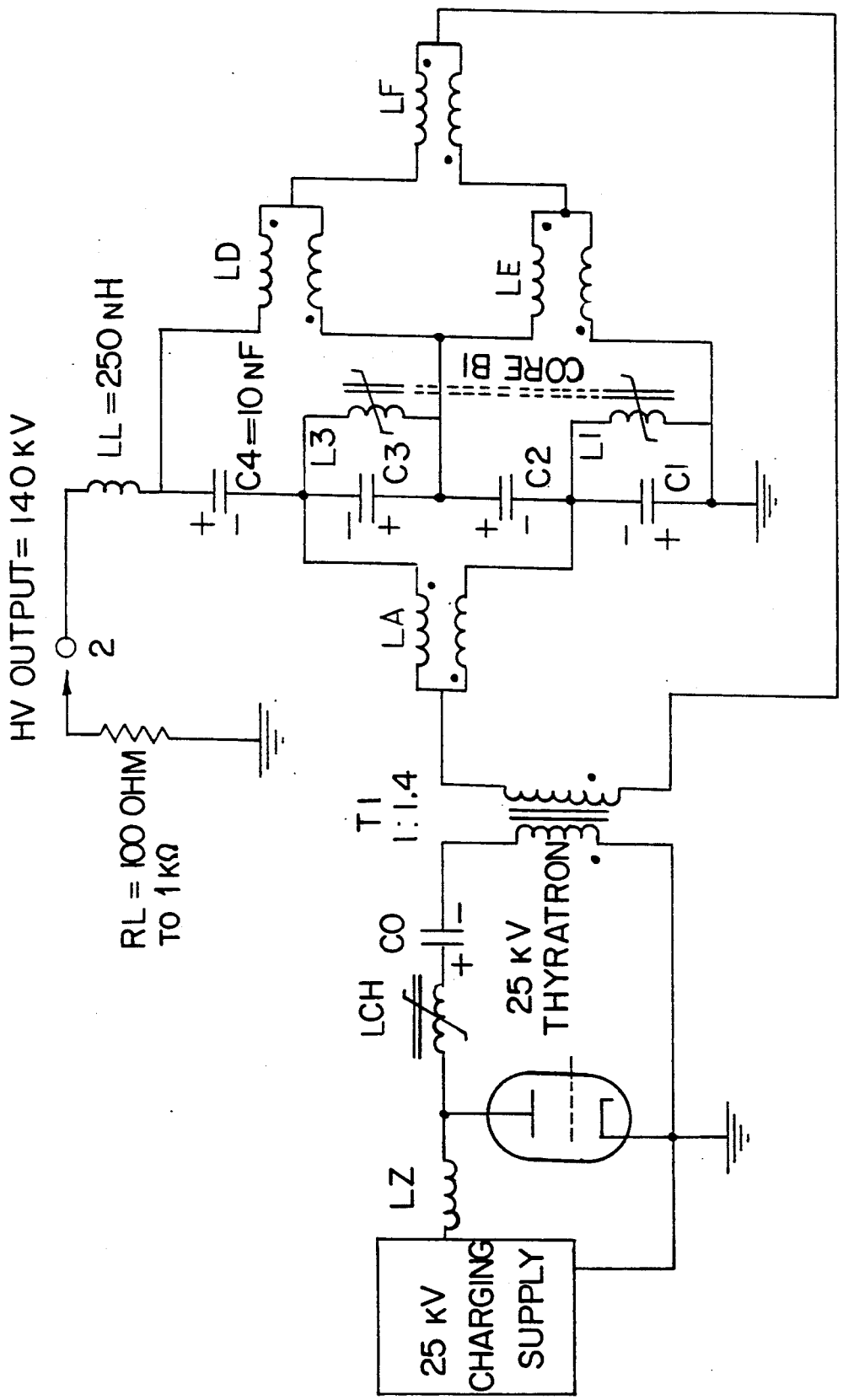
FIG. 5 is a schematic diagram of a high PRF, 140 kV, 10-ohm pulse generator employing a magnetically switched 4-stage LC inverter constructed in accordance with one embodiment of the present invention.

Referring now to FIG. 5, there is illustrated a complete schematic diagram of a magnetically switched 4-stage LC inverter that comprises capacitors C1-C4, the associated saturable inductors L1 and L3, and the charging network. Electric charge is initially stored in capacitor C0, which has been DC charged from a charging supply through inductors LZ and LCH. When the 25 kV thyratron is triggered and after inductor LCH saturates, the charge is transferred from C0 to the capacitors C1-C4 in the multiplier chain in approximately 1 microsecond, as illustrated by the waveform representing the charging current in the waveform diagram of FIG. 6. A pulse transformer T1 permits the voltage to be stepped up during the charging process. It should be noted that capacitors C1-C4 are charged symmetrically through inductors LA, LD, LE, and LF. Each of these inductors comprises two coils, wound for minimum leakage inductance (bifilar or coaxial) in such a way (with opposing mutual inductance) that these inductors have a very low inductance during charging (with two coils in parallel) and a high inductance for current flowing through the two coils in tandem. These inductors may be air coils or they may be wound on iron cores. Calculations and experimentation have shown that air inductors can be made with inductance ratios (series vs. parallel) of 200 to 400 (e.g. 0.6 mH vs. 2 uH). Iron or ferrite core inductors may be made with inductance ratios as high as 10,000. Symmetric charging of the multiplier chain is necessary so that both the charging thyratron and the lower end of the voltage multiplier can be referenced to ground and so that all of the capacitors charge at the same rate.

Figure 4:
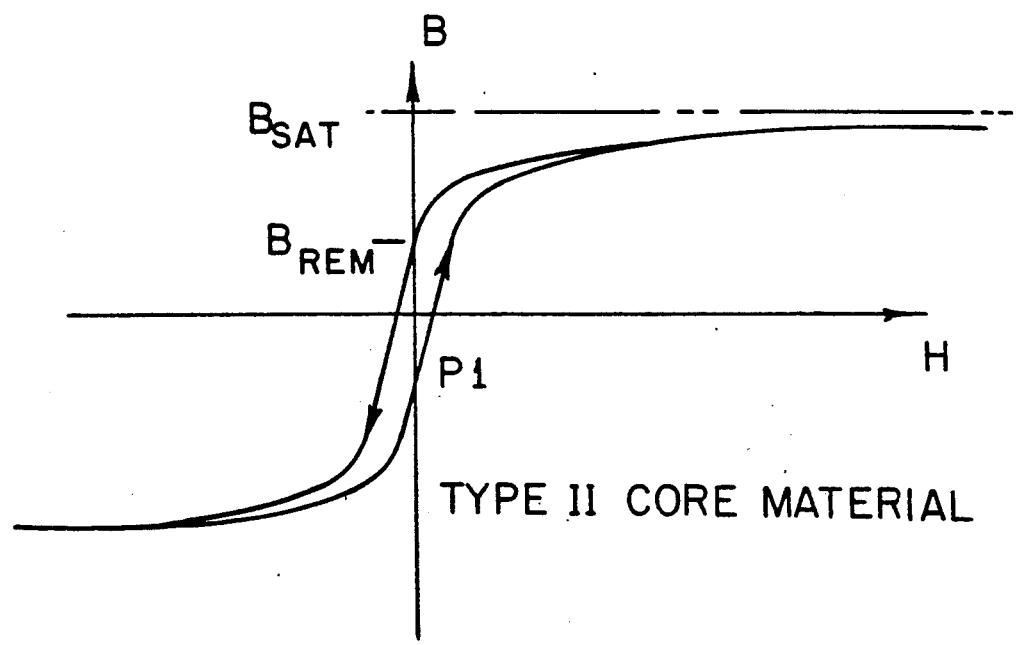
FIG. 4 is a hysteresis diagram illustrating the inclined hysteresis loop that is typical of core materials of the type comprising most ferrite cores and unannealed iron cores, herein referred to as Type 11 core materials.

Core 1, which is common to inductors L1 and L3, is designed to saturate at the point at which charging is complete and the current through inductor LCH has started to reverse The two windings on core 1 comprise only one or two turns each to make the saturated inductance as small as possible. This results in a fast rise of the output pulse. When core 1 saturates, the charge on capacitors C1 and C3 will ring to the opposite polarity in a time period represented by the expression $pi.(C1 \times L1_{sat})^{0.5}$ to produce the quadrupled voltage pulse. The voltage rise time for an LC inverter is slower than in a Marx circuit. The advantage of an LC inverter is that the switch inductances do not add to the output impedance. In effect, voltage rise time is sacrificed for faster current rise. For purposes of analysis, the saturated inductances of the coils on core 1 were taken to be 400 nH. The corresponding voltage rise time was observed to be 120 nanoseconds, as illustrated in the waveform diagram of FIG. 6. In practice, it is possible to reduce the saturated coil inductances to 50 nH, which would cause the voltage rise time to be approximately 40 nanoseconds. This rise time will be independent of the number of stages. Saturable inductor LCH in FIG. 5 is necessary to prevent charge from leaking back into capacitor C0. Since this leakage current would be in the same direction as the charging current, the material chosen for the core of inductor LCH should preferably be a Type II material, whose hysteresis characteristics are illustrated in FIG. 4. This diagram illustrates a significant difference between Bsat and Brem, a characteristic exhibited by ferrite cores and certain unannealed silicon-iron cores.

Figure 7:
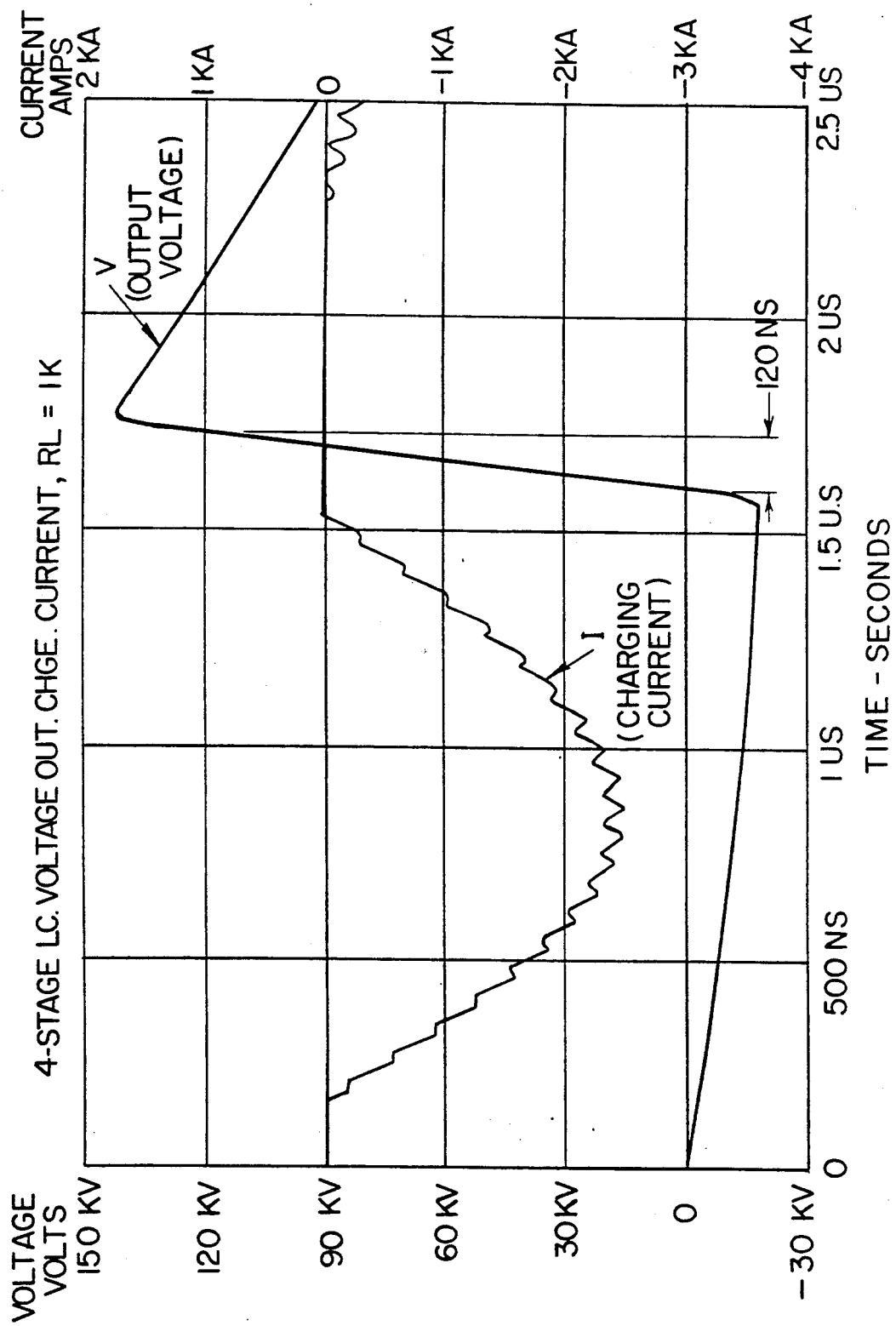
FIG. 7 is a waveform diagram illustrating computed waveforms of the charging current and the output voltage associated with the pulse generator of FIG. 5.

A computer analysis of the circuit of FIG. 5 was performed for an output inductance LL of 250 nH and a fixed resistive load RL of 1 kohm. The latter determines the voltage droop after the pulse is erected. The computer model included realistic hysteresis effects and losses for core 1. Similarly, the non-linear characteristics of all other circuit components were taken into account. The calculated charging current and output voltage at terminal 2 as functions of time are illustrated in the waveform diagram of FIG. 7. It should be noted that the output voltage is higher than four times the charging voltage because the charging voltage is stepped up somewhat by transformer T1 of FIG. 5.

Figure 6:
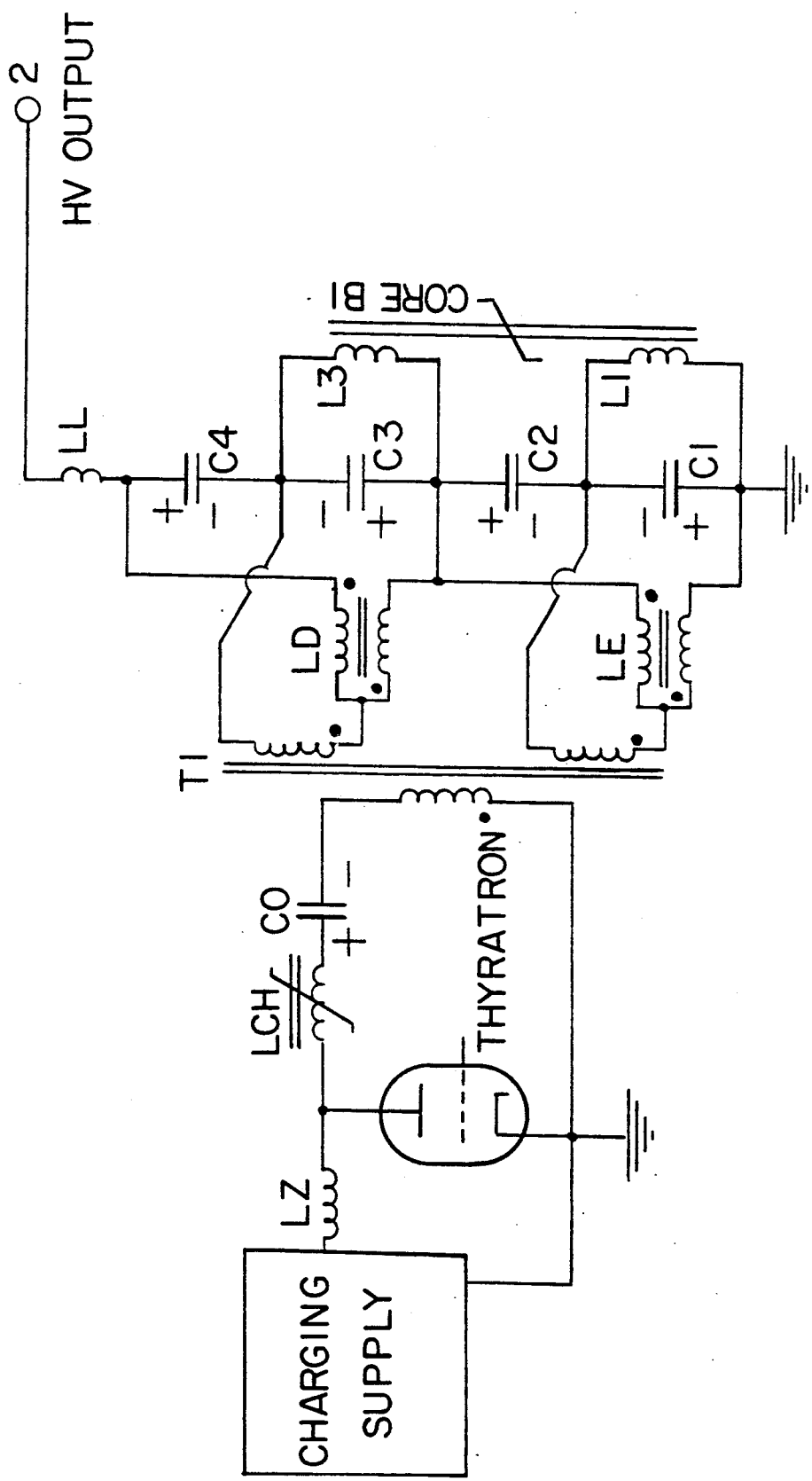
FIG. 6 is a schematic diagram of a variation of the 4-stage LC inverter of FIG. 5, differing therefrom in the way in which the capacitor stack is charged.

The 4-stage LC inverter shown schematically in FIG. 6 is a variation of the voltage multiplier of FIG. 5. It permits charging of capacitors C1-C4 at a more even rate. Furthermore, the circuit of FIG. 6 may be easily extended to apply to voltage multipliers having a large number of stages. It should be noted that in this circuit the capacitors are charged via two separate secondary windings on transformer T1. This eliminates the necessity for coils LA and LF of the circuit of FIG. 5. Otherwise, the circuit illustrated in FIG. 6 performs the same as that of FIG. 5. The circuits of both figures use the same component designators for components that are common to both circuits.

Figure 8:
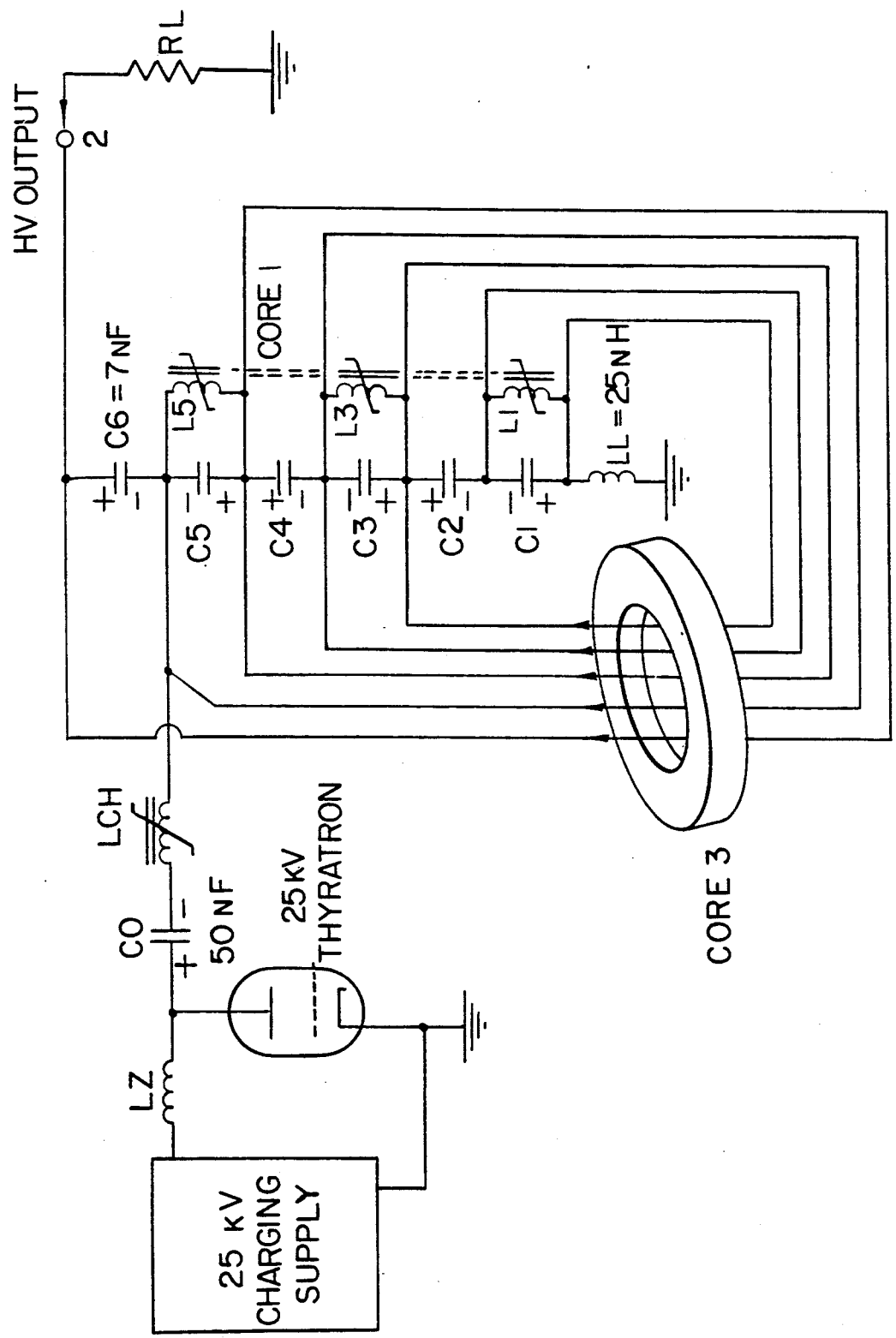
FIG. 8 is a schematic diagram of a high PRF, 150 kV, 5-ohm pulse generator employing a magnetically switched 6-stage LC spiral inverter constructed in accordance with a alternative embodiment of the present invention.

Referring now to FIG. 8, there is shown a lumped component version of a 6-turn spiral generator of the type described by C. A. Brau et al., Simple, Pulsed, Electron Beam Gun, Rev. Scient. Instrum. 48 (1977) 1154, with the addition of pulse charging circuitry and the magnetic switches of the present invention. The disadvantages of the prior art spiral generators described by Brau et al., such as slow erection time and inefficient voltage multiplication caused by turn-to-turn leakage, have been eliminated in the circuit of FIG. 8.

A string of six capacitors C1-C6 is pulse charged in approximately 1 microsecond, as described above. Again, inductor LCH, wound on a Type II core, is necessary to prevent charge from leaking back into capacitor C0. A core 3 prevents turn-to-turn back leakage after the multiplier is erected. The charging paths for the multiplier capacitors C1-C6 have been chosen so that they all pass through saturable core 3 with the charging currents flowing in the same direction.

Instead of using a single switch, as in prior art spiral generators, the embodiment of the present invention illustrated in FIG. 8 employs three switches L1, L3, L5 that are activated by saturation of the single core 1. When core 1 saturates, the charges on the odd numbered ones of capacitors C1-C6 are inverted to produce the output pulse at terminal 2.

Figure 9:
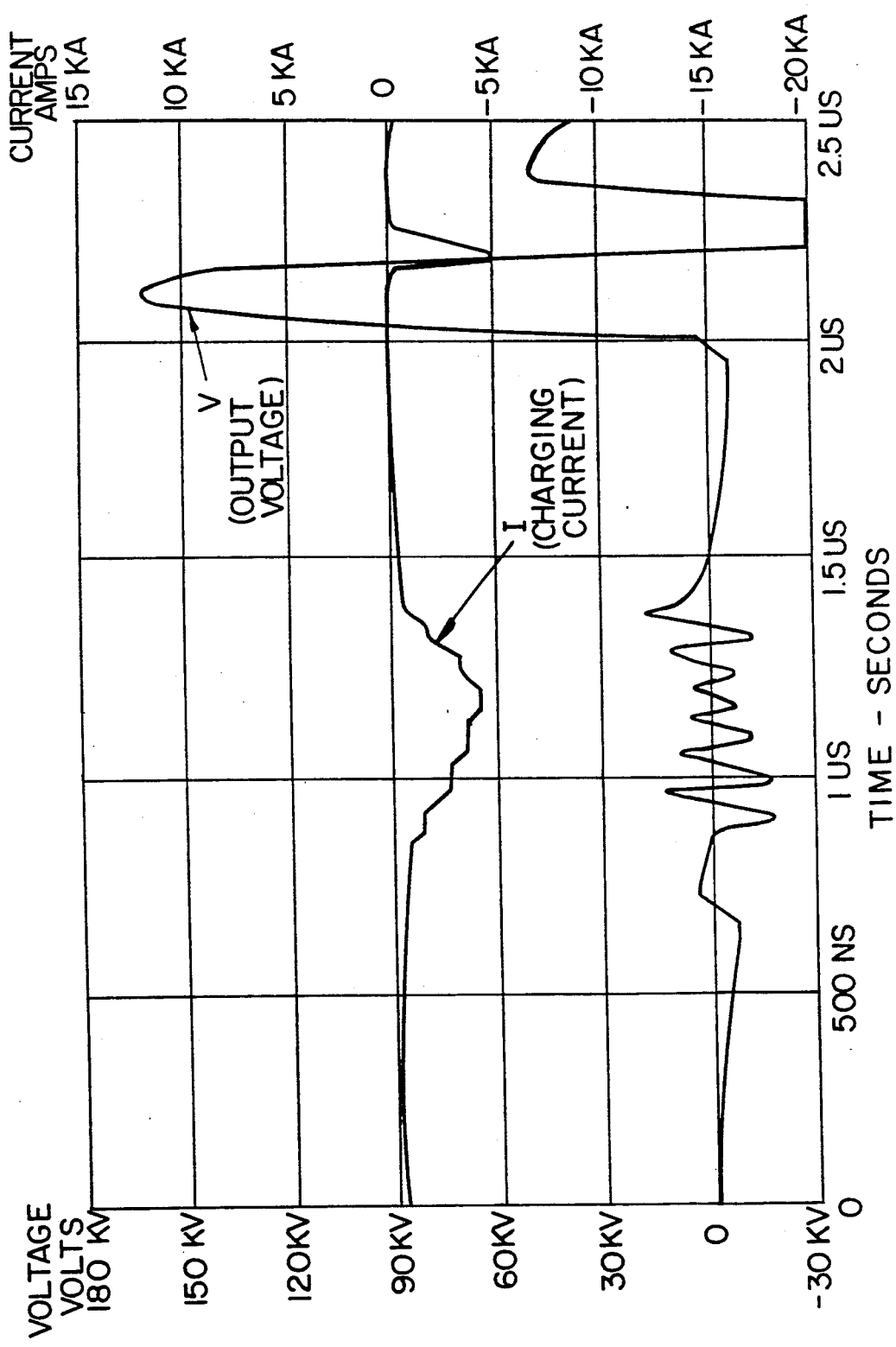
FIG. 9 is a waveform diagram illustrating computed waveforms of the charging current and the output voltage associated with the pulse generator of FIG. 7.

Referring now to FIG. 9, there are shown waveform diagrams of the charging current through saturable charging inductor LCH and the output voltage at terminal 2 for the circuit of FIG. 8. It is noteworthy that the output voltage, after exceeding 150 kV for approximately 100 nanoseconds, suddenly drops off sharply due to leakage back through saturable charging inductor LCH. This characteristic is confirmed by the negative current spike at that time in the waveform of charging current. The width of the voltage pulse can therefore be extended by allowing inductor LCH to go further into "unsaturation" in the reverse direction before letting core 1 saturate.

I claim:

1. A multiple stage Marx bank voltage multiplier circuit for generating a high output voltage pulse that is a multiple of a charging voltage pulse, said multiple being equal to the number of stages of the circuit, the circuit comprising:

inductive pulse charging means for providing said charging voltage pulse during a pulse charging cycle;

a saturable core inductor having a plurality of windings thereon; and a plurality of capacitors corresponding in number to the plurality of windings on said saturable core inductor, each of said plurality of capacitors being connected in series with a corresponding one of said plurality of windings to form a stage of said circuit, each stage of said circuit so formed being connected in series with another stage of said circuit;

each of said plurality of windings on said saturable core inductor being operative as a passive magnetic switch by presenting a high impedance, during said pulse charging cycle in which each of said plurality of capacitors is charged by said charging voltage pulse, and by then presenting a low impedance following core saturation of said saturable core inductor at the end of said pulse charging cycle, thereby resulting in multiplying the charging voltage pulse by which each of said plurality of capacitors is charged to generate said high output voltage pulse.

2. A multiple stage Marx bank voltage multiplier circuit as in claim 1 wherein said saturable core inductor comprises a material having a square hysteresis loop characteristic.

3. A multiple stage LC inverter voltage multiplier circuit for generating a high output voltage pulse that is a multiple of a charging voltage pulse, said multiple being equal to the number of stages of the circuit, the circuit comprising:

inductive pulse charging means for providing said charging voltage pulse during a pulse charging cycle;

a saturable core inductor having a plurality of windings thereon; and a plurality of capacitors that is double the plurality of windings on said saturable core inductor, said plurality of capacitors being connected serially in back-to-back polarity relationship, alternate ones of said plurality of capacitors being shunted by a corresponding one of said plurality of windings;

each of said plurality of windings on said saturable core inductor being operative as a passive magnetic switch by presenting a high impedance, during said pulse charging cycle in which each of said plurality of capacitors is charged by said charging voltage pulse, and by then presenting a low impedance following core saturation of said saturable core inductor at the end of said pulse charging cycle, thereby resulting in multiplying the charging voltage pulse by which each of said plurality of capacitors is charged to generate said high output voltage pulse.

4. A multiple stage LC inverter voltage multiplier circuit as in claim 3 wherein said saturable core inductor comprises a material having a square hysteresis loop characteristic.

5. A multiple stage LC inverter voltage multiplier circuit as in claim 3 wherein said inductive pulse charging means comprises a plurality of charging inductors through which each of said plurality of capacitors is symmetrically charged during said pulse charging cycle.

6. A multiple stage LC inverter voltage multiplier circuit as in claim 5 wherein said inductive pulse charging means further comprises pulse transformer means having multiple secondary windings through which each of said plurality of capacitors is symmetrically charged during said pulse charging cycle.

7. A multiple stage LC inverter voltage multiplier circuit as in claim 5 wherein each of said plurality of charging inductors comprises a bifilar wound coil having a low inductance during said pulse charging cycle and a high inductance following said pulse charging cycle.

8. A multiple stage LC inverter voltage multiplier circuit as in claim 5 wherein each of said plurality of charging inductors comprises a coaxially wound coil having a low inductance during said pulse charging cycle and a high inductance following said pulse charging cycle.

9. A spiral generator voltage multiplier circuit for generating a high output voltage pulse that is a multiple of a charging voltage pulse, said multiple being equal to the number of stages of the circuit, the circuit comprising:

pulse charging means for providing said charging voltage pulse during a pulse charging cycle;

a saturable core inductor having a plurality of windings thereon;

a plurality of capacitors that is double the plurality of windings on said saturable core inductor, said plurality of capacitors being connected serially in back-to-back polarity relationship, alternate ones of said plurality of capacitors being shunted by a corresponding one of said plurality of windings; and a blocking core having a plurality of turns thereon, each of said plurality of turns being connected across adjacent pairs of said plurality of capacitors for preventing back leakage from said plurality of capacitors;

each of said plurality of windings on said saturable core inductor being operative as a magnetic switch by presenting a high impedance, during said pulse charging cycle in which each of said plurality of capacitors is charged by said charging voltage pulse, and by then presenting a low impedance following core saturation of said saturable core inductor at the end of said pulse charging cycle, thereby resulting in multiplying the charging voltage pulse by which each of said plurality of capacitors is charged to generate said high output voltage pulse.

* * * * *